(12) United States Patent
He

(10) Patent No.: US 6,298,078 B1
(45) Date of Patent: Oct. 2, 2001

(54) LASER DIODES WITH COMPOSITE MATERIAL SYSTEMS WHICH DECOUPLE REFRACTIVE INDEX AND BAND GAP PROFILES

(75) Inventor: Xiauguang He, Tucson, AZ (US)

(73) Assignee: Opto Power Corporation, Tucson, AZ (US)

( * ) Notice: Subject to any disclaimer, the term of this patent is extended or adjusted under 35 U.S.C. 154(b) by 0 days.

(21) Appl. No.: 09/257,906

(22) Filed: Feb. 25, 1999

(51) Int. Cl.$^7$ ........................................................ H01S 5/00
(52) U.S. Cl. ................................................. 372/45; 372/44
(58) Field of Search .................................. 372/45, 46, 44

(56) References Cited

U.S. PATENT DOCUMENTS

| 4,740,977 | * | 4/1988 | Ikeda | 372/45 |
| 5,105,236 | * | 4/1992 | Hayakawa | 372/45 |
| 5,222,090 | * | 6/1993 | Serreze | 372/45 |

* cited by examiner

Primary Examiner—Quyen P. Leung
(74) Attorney, Agent, or Firm—Herbert M. Shapiro

(57) ABSTRACT

Laser diodes are formed using composite material systems which result in the decoupling of the refractive index and band gap profiles of the structures formed with such systems. Laser diodes with composite material systems are described which produce desirable large diameter laser beams and low beam divergence through independent control of the two profiles.

3 Claims, 6 Drawing Sheets

LASER DIODES WITH COMPOSITE MATERIAL SYSTEMS WHICH DECOUPLE REFRACTIVE INDEX AND BAND GAP PROFILES

FIELD OF THE INVENTION

This invention relates to laser diodes and more particular to laser diodes which include composite material systems.

BACKGROUND OF THE INVENTION

A composite material system is a material system that includes materials which consist of different elements, but have the same band gap. For example, $Al_xGa_{1-x}As$ has the direct band gap energy of 1.42 eV to 1.98 eV for 0 <x <0.45. $Ga_xIn_{1-x}As_yP_{1-y}$ lattice matched to GaAs has the direct band gap energy of 1.42 eV to 1.89 eV and AlGaInP lattice matched to GaAs has the direct band gap energy higher than 1.89 eV. Therefore, AlGaAs/GaInAsP or AlGaAs/AlGaInP forms a composite material system.

Prior art laser diodes use only one single material system where the deposited layers which define the laser are of the same material system except that the layers include the various compositions of the elements which adjusts the energy gap profile of the layers as is well understood. Thus the familiar material systems include, for example, GaAs/AlGaAs, GaInAsP/GaInP and GaInAsP/AlGaInP.

In diodes where a single material system is used, the refractive index is a single function of the band gap of the material. That is to say, the lower the refractive index, the higher the band gap.

For the composite material system, the refractive index is not only a function of the band gap, but also is a function of material system. FIG. 3 shows the refractive index of AlGaAs and AlGaInP, which belong to different material systems. For the same bandgap energy, the difference of refractive index between AlGaAs and AlGaInP can be as large as 0.08. This difference in refractive index is enough to achieve some laser structures with preferred characteristics.

BRIEF DESCRIPTION OF THE INVENTION

In accordance with the principles of this invention, composite material systems, such as AlGaAs/GaInAsP and AlGaAs/AlGaInP, are used to form laser diodes where the materials are chosen to decouple the refractive index profile and the band gap profile, in other word, the electrical confinement profile and the optical confinement profile will be engineered separately to provide a new flexibility in laser diode structure design.

In one embodiment, an AlGaAs/AlGaInP composite material system is used to produce a laser diode which emits a large diameter light spot at the diode facet to significantly lower the optical density in the quantum well. A similar structure with only a single material system suffers from the difficulty of the injection of carriers into the quantum well.

In another embodiment, a passive waveguide structure is produced by a composite material system in which case the passive waveguide will not cause carrier trapping at the passive waveguide region because the band gap of the wave guiding area is the same as that of the cladding layer because of the composite material system. The advantage with passive waveguide structure is the significantly lower transverse far field divergence even with the same optical confinement factor at quantum well.

DETAILED DESCRIPTION OF ILLUSTRATIVE EMBODIMENTS OF THIS INVENTION

Figure 1:
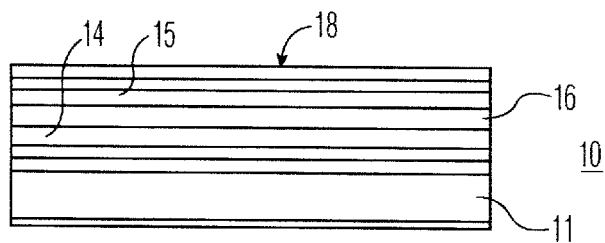
FIG. 1 is a schematic representation of a laser diode structure.

FIG. 1 shows a schematic view of a laser diode structure 10. The diode includes a substrate 11 with a plurality of layers formed thereon, (typically by metal organic chemical vapor deposition) as is well understood. The layers include two wave guiding layers 14 and 15 which sandwich a layer 16 therebetween. Layer 16 defines the familiar quantum well of the structure.

Figure 2:
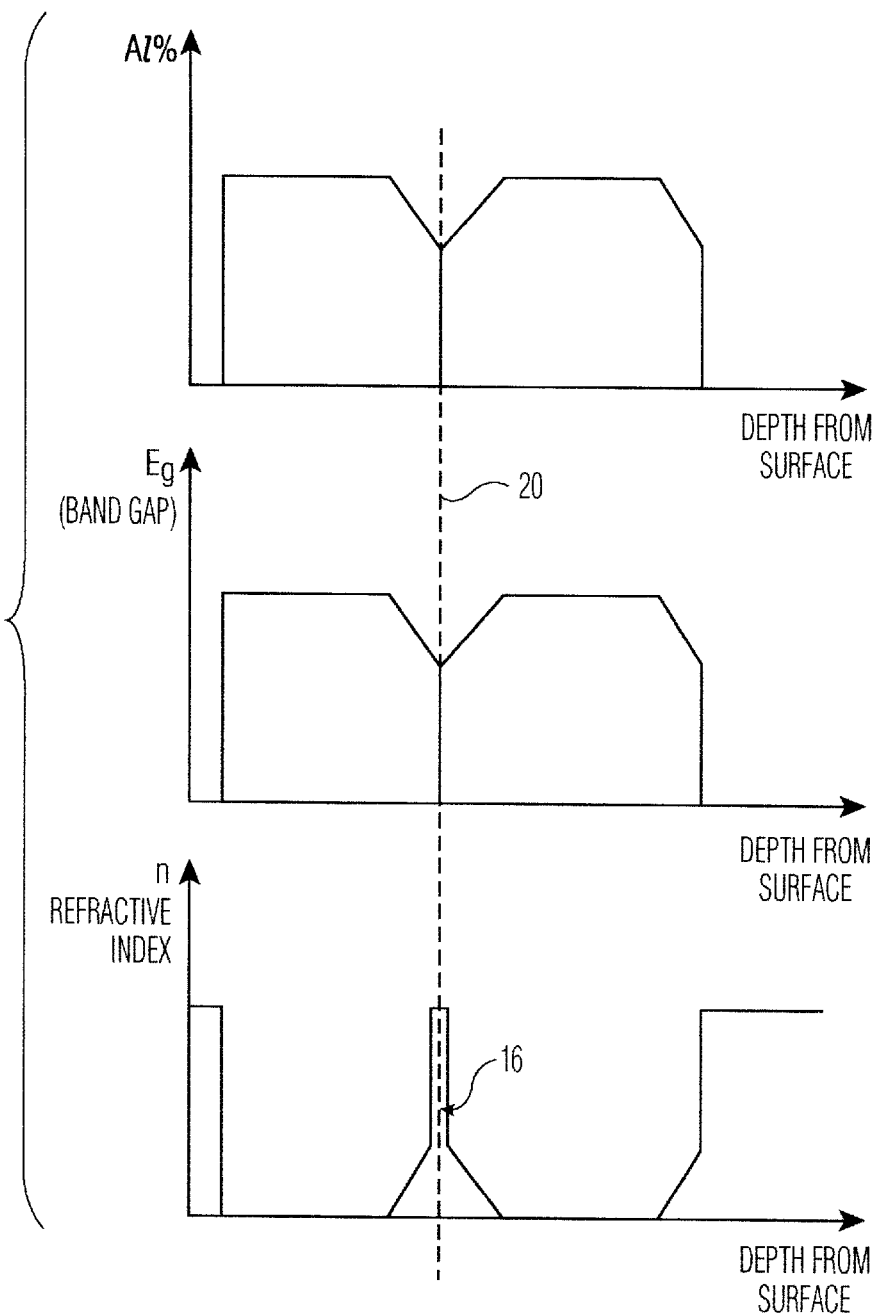
FIG. 2 is a schematic graphical representation of the corresponding aluminum, band gap and refractive index profiles typical of a single material, prior art laser diode.

FIG. 2 shows the familiar graphical representation of characteristics of the diode of FIG. 1 for single material systems. Specifically, FIG. 2 shows three graphical representations aligned along imaginary axis 20 represented by the vertical broken line so designated. Axis 20 corresponds to the center of the quantum well 16 as shown.

The vertical (y) axis of the top, middle and lower graphs (as viewed) represent the aluminum (Al) concentration, the band gap (Eg) and the refractive index (n) of the diode of FIG. 1 for a single material system. The horizontal axis (x) is the distance from the top surface 18 of the diode of FIG. 1. It is clear from FIG. 1, as the aluminum concentration is reduced, the band gap is reduced and the refractive index increases. There is no single material system known in which the index of refraction decreases with increase in band gap energy. Yet, it is desirable to increase the band gap and decrease the index of refraction.

In accordance with the principles of this invention, a diode is made with a composite material system rather than with a single material system, the former providing a refractive index which is a function of the material system, the band gap, and the lasing wavelength. The result of using a composite material system is a flexible diode structure design with a separate control of the band gap profile and the refractive index profile.

The loosening of the coupling between the refractive index and the band gap profiles of a composite material system in accordance with the principles of this invention permits, for example, in an illustrative embodiment, the fabrication of a diode with a waveguide layer with a given band gap energy, but with a significant different index of refraction which could not be achieved with single material systems. As a result, a diode can be fabricated, for example, with a relatively large diameter emitted beam.

Figure 3:
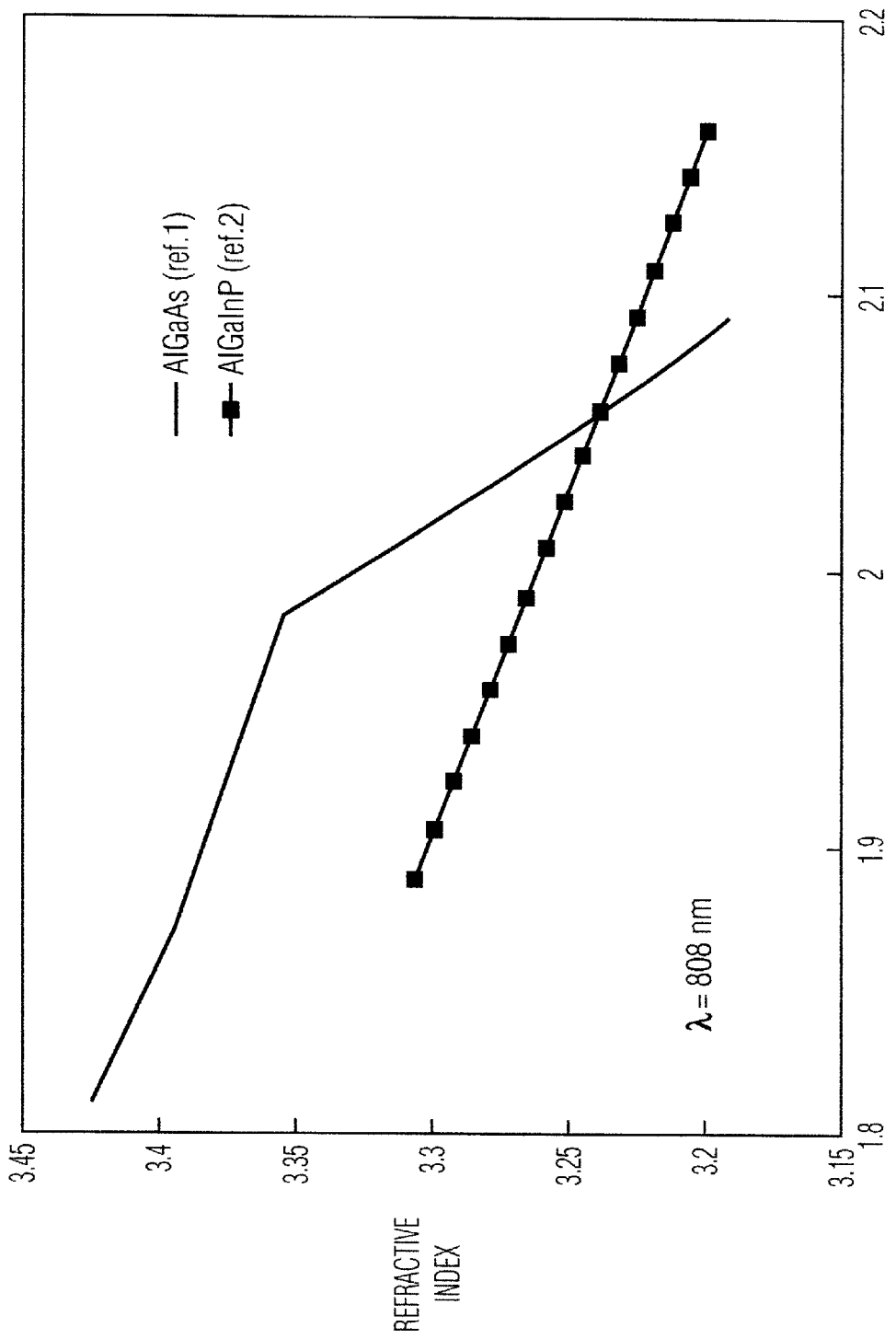
FIG. 3 is the refractive index of AlGaAs and AlGaInP as a function of band gap at a lasing wavelength of 808 nm.

FIG. 3 shows the refractive index of AlGaAs and AlGaInP as a function of band gap at a lasing wavelength of 808 nm. The figure shows a composite material system consisting of AlGaAs and AlGaInP, where for a given band gap energy, we can achieve different refractive indicies.

Figure 4:
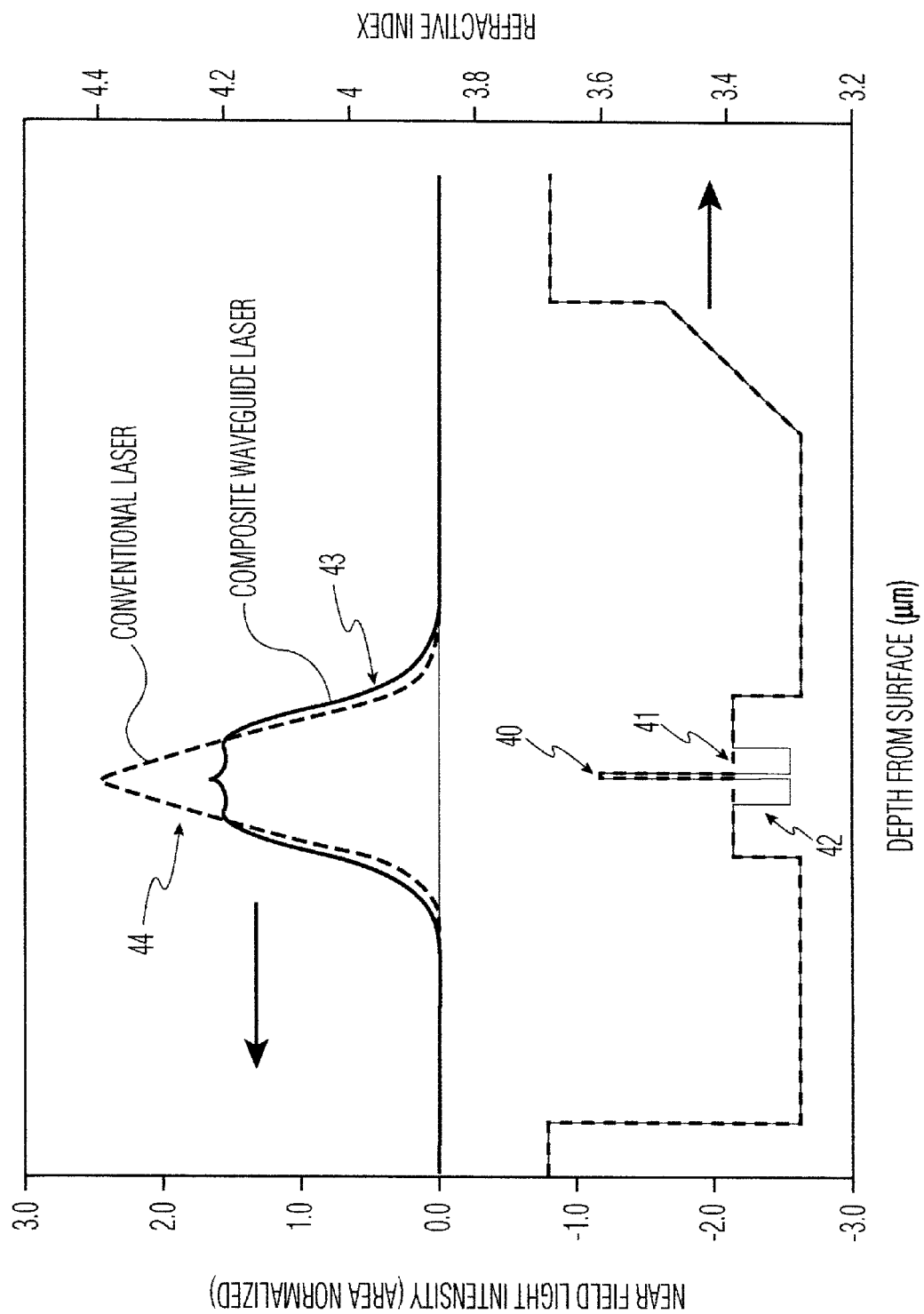
FIG. 4 is a schematic graphical representation of a refractive index profile that significantly lowers the optical density (near field shown in the figure) at the quantum well of a laser diode.

FIG. 4 shows a schematic graphical representation of a refractive index profile that significantly lowers the optical density (near field shown in FIG. 4) at the quantum well of a laser diode. FIG. 4 (the top curves) illustrates the near field intensity generated from the refractive index profile shown in FIG. 4 at broken line 41. The solid profile in (42) FIG. 4 gives rise to the solid near field profile (43) in FIG. 4, while the dashed profile (41) generates the dashed near field profile (44). As can seen from FIG. 4, the light intensity at quantum well 40 is significantly lower for the solid line than dash line. The dash line represents a typical prior art laser diode.

Figure 5:
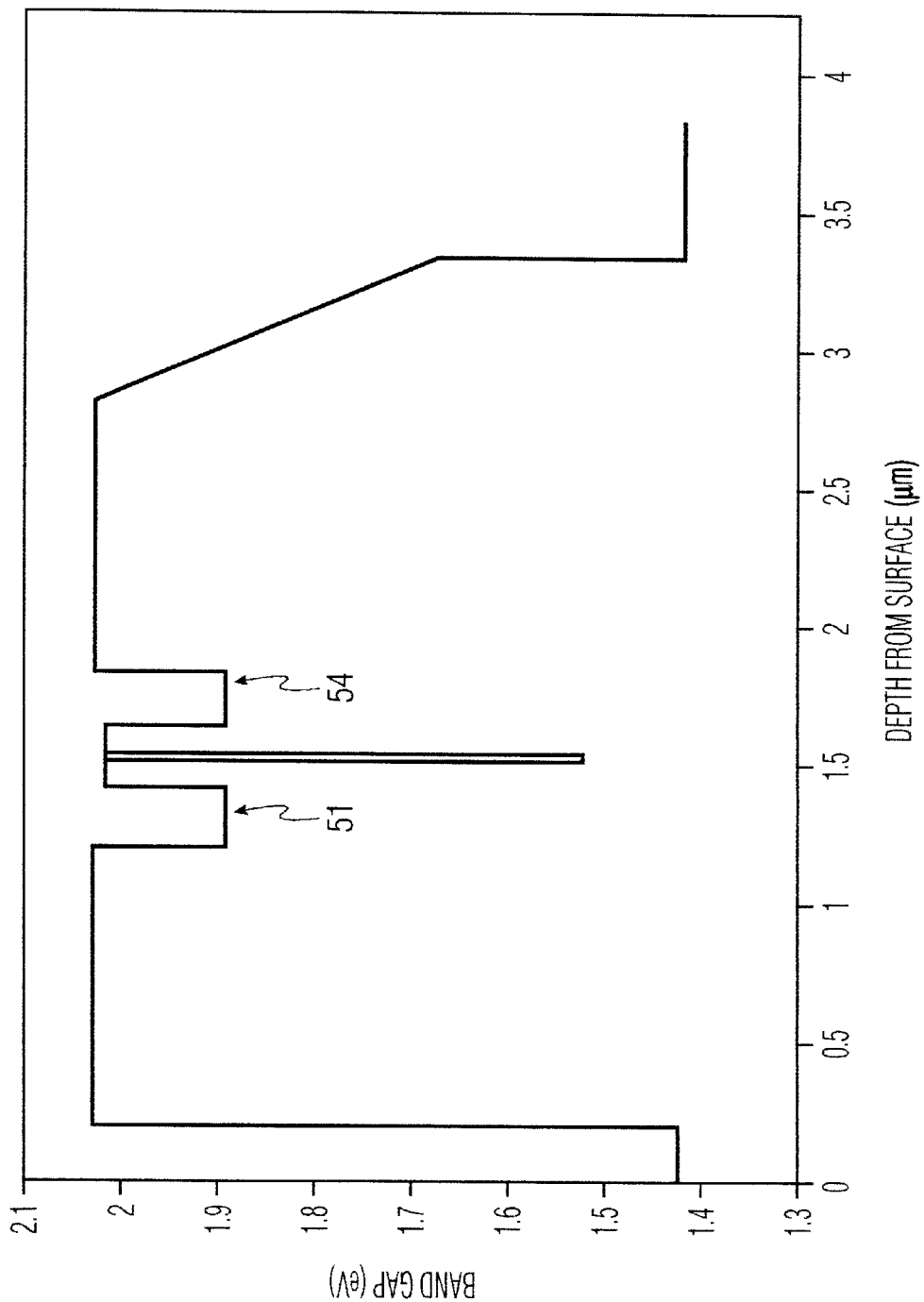
FIG. 5 is a schematic graphical representation of band gap profiles achieved with a single AlGaAs system which corresponds to the refractive index profile FIG. 4.

FIG. 5 shows a schematic graphical representation of band gap profiles achieved with a prior art single AlGaAs system which corresponds to the solid line refractive index profile of FIG. 4. For the structure in FIG. 5, carrier trapping at layers 51 and 54 result in the poor performance of the device.

Figure 6:
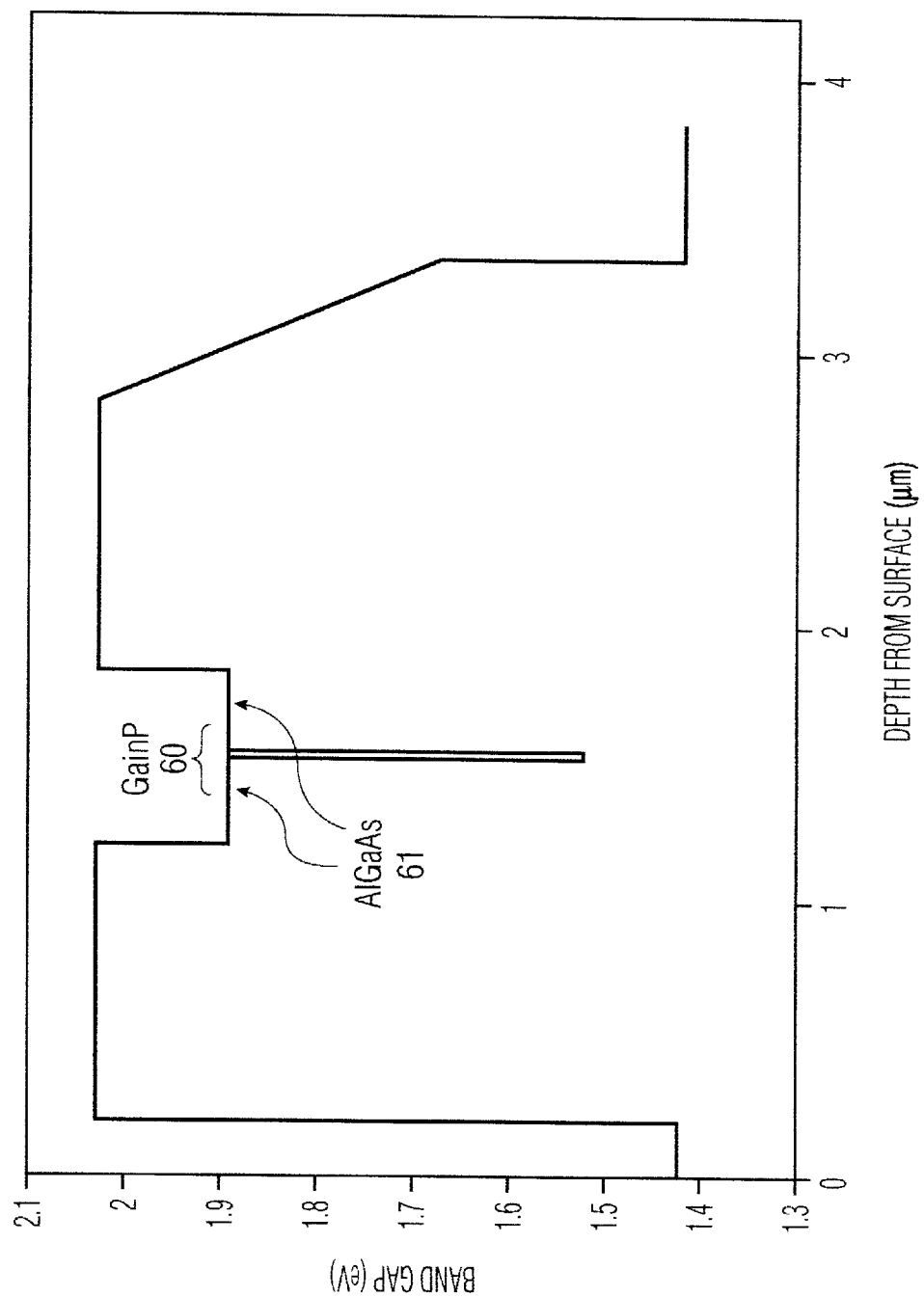
FIG. 6 is a schematic representation of a laser diode, in accordance with the refraction index profiles achieved with GaInP/AlGaAs composite material system shown in FIG. 4.

FIG. 6 is a schematic representation of a laser diode, in accordance with the solid line refraction index profiles shown in FIG. 4, achieved with GaInP/AlGaAs composite material system. The low refractive indices of GaInP 60 to either side of the quantum well enables the expansion of the mode, resulting in lower power density at the quantum well as shown in FIG. 4 (solid line). The presence of the same bandgap energy of AlGaAs 61 (with higher refractive indices) in the outer portion of waveguide avoids the trapping of carriers.

Figure 7:
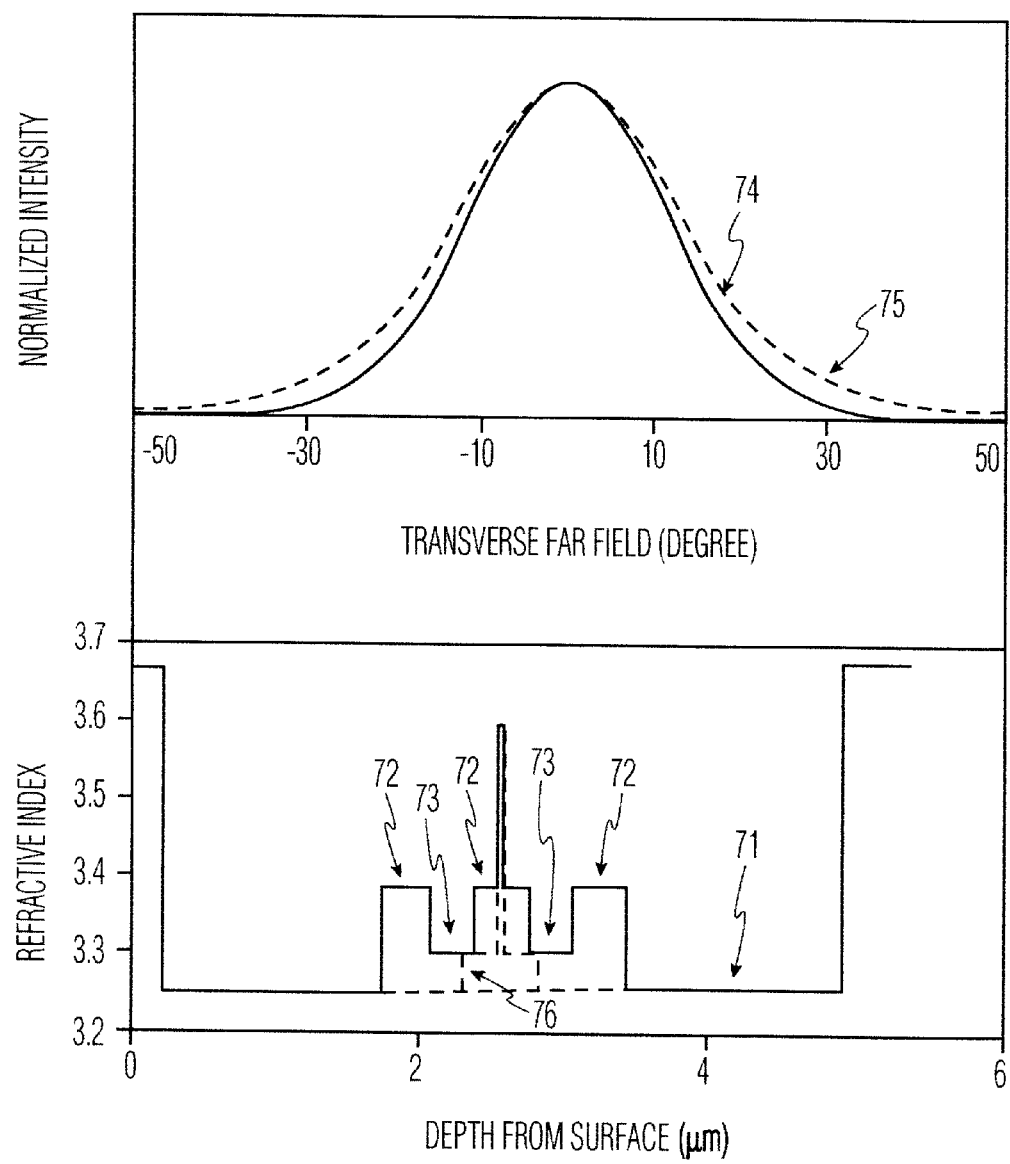
FIG. 7 is a schematic representation of the refraction profiles respectively, of a second embodiment in accordance with the principles of this invention. The solid line is the proposed structure of second embodiment. The dash line is the conventional GaInP/AlGaInP laser which create the same confinement factor as proposed structure.

FIG. 7 shows a schematic representation of the refraction profiles respectively, of a second embodiment in accordance with the principles of this invention. The solid line illustrates the structure of the second embodiment. The dash line illustrates the conventional GaInP/AlGaInP laser which creates the same confinement factor as that of the second embodiment. Layer 71 is AlGaInP cladding layer. Layers 72 and 73 are waveguides with the composite material system consisting of AlGaAs and GaInP. The AlGaAs region 72 and GaInP region 73 have the same band gap energy, but with different refractive indices as shown in FIG. 3. The refractive index profile of the composite material system (solid line) shown in FIG. 7 gives rise to far field represented by dotted line 75 in FIG. 7. Also in the figure is the refractive index profile 76 of a convention GaInP/AlGaInP laser that give rise to the far field 75 in FIG. 7. The refractive index profile 76 has the same confinement factor (that is the near field optical intensity at quantum well) as the refractive index profile of the composite material system (solid line). However, as can be seen in the figure, the far field 74 of the composite material system structure is much lower than that of the conventional GaInP/AlGaInP laser. A second embodiment in accordance with the principles of this invention results in a higher brightness (lower divergent far field) laser diode.

What is claimed:

1. A laser diode having a substrate and a plurality of layers formed thereon for defining a light beam-emitting facet, said plurality of layers comprising an active layer, a first and second inner waveguiding layers sandwiching the active layer, a first and second outer waveguiding layers sandwiching the first and second inner waveguiding layers, said inner waveguiding layers having the same band gap but different refractive index from said outer waveguiding layers.

2. A laser diode as in claim 1 wherein said inner waveguiding layers comprise AlGaInP and said outer waveguiding layers comprise AlGaAs.

3. A laser diode as in claim 1 wherein said inner waveguiding layers comprise GaInAsP and said outer waveguiding layers comprise AlGaAs.

* * * * *